United States Patent
Luan

(10) Patent No.: US 9,455,292 B2
(45) Date of Patent: Sep. 27, 2016

(54) IMAGE SENSING DEVICE WITH INTERCONNECT LAYER GAP

(71) Applicant: STMICROELECTRONICS PTE LTD, Singapore (SG)

(72) Inventor: Jing-En Luan, Shenzhen (CN)

(73) Assignee: STMICROELECTRONICS PTE LTD, Singapore (SG)

(*) Notice: Subject to any disclaimer, the term of this patent is extended or adjusted under 35 U.S.C. 154(b) by 0 days.

(21) Appl. No.: 14/741,561

(22) Filed: Jun. 17, 2015

(65) Prior Publication Data

US 2016/0104738 A1 Apr. 14, 2016

(30) Foreign Application Priority Data

Oct. 11, 2014 (CN) .......................... 2014 1 0537533

(51) Int. Cl.
*H01L 31/0232* (2014.01)
*H01L 27/146* (2006.01)

(52) U.S. Cl.
CPC ... *H01L 27/14636* (2013.01); *H01L 27/14618* (2013.01); *H01L 27/14625* (2013.01); *H01L 27/14685* (2013.01); *H01L 2224/48095* (2013.01); *H01L 2224/73265* (2013.01)

(58) Field of Classification Search
CPC .................. H01L 27/14636; H01L 27/14618; H01L 27/1462; H01L 27/14625; H01L 27/14685
USPC ......................................................... 257/432
See application file for complete search history.

(56) References Cited

U.S. PATENT DOCUMENTS

| | | | |
|---|---|---|---|
| 7,880,132 B2 | 2/2011 | Brodie et al. | |
| 8,193,555 B2* | 6/2012 | Lin ................... | H01L 27/14618 257/294 |
| 2005/0116138 A1* | 6/2005 | Hanada ................... | H01L 24/97 250/206 |
| 2010/0200898 A1* | 8/2010 | Lin ................... | H01L 27/14618 257/294 |
| 2013/0128106 A1* | 5/2013 | Tam ..................... | H04N 5/2253 348/374 |

* cited by examiner

*Primary Examiner* — Caleb Henry
(74) *Attorney, Agent, or Firm* — Allen, Dyer, Doppelt, Milbrath & Gilchrist, P.A.

(57) ABSTRACT

An image sensing device may include an interconnect layer, an image sensor IC coupled to the interconnect layer and having an image sensing surface, and an IR filter aligned with the image sensing surface opposite the interconnect layer. The image sensing device may include a flexible interconnect layer aligned with the interconnect layer and having a flexible substrate extending laterally outwardly from the interconnect layer, and electrically conductive traces on the flexible substrate. The image sensing device may also include solder bodies coupling the interconnect layer and the flexible interconnect layer and also defining a gap between the interconnect layer and the flexible interconnect layer.

24 Claims, 4 Drawing Sheets

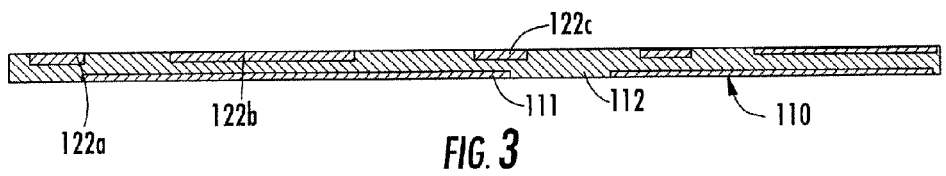
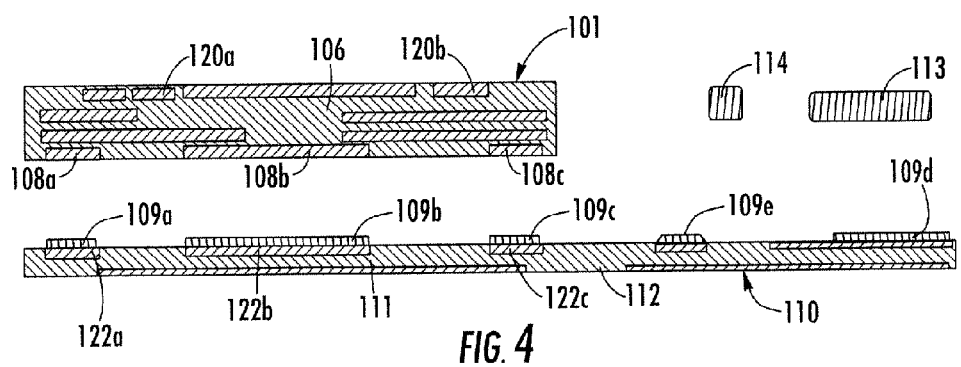
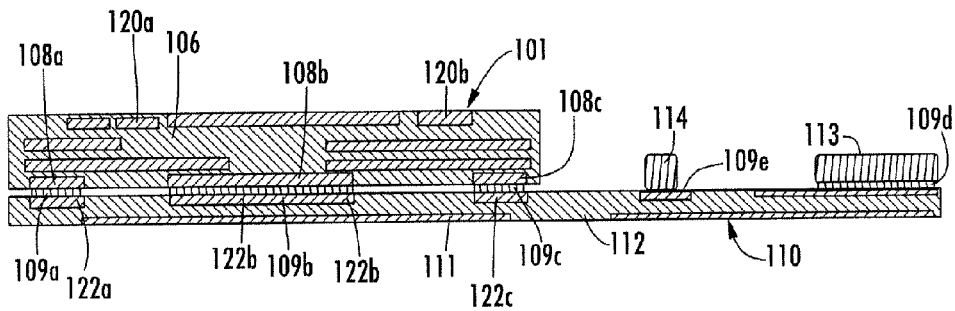

IMAGE SENSING DEVICE WITH INTERCONNECT LAYER GAP

RELATED APPLICATION

This application is based upon prior filed copending Application No. 201410537533.3 filed Oct. 11, 2014, the entire subject matter of which is incorporated herein by reference in its entirety.

FIELD OF THE DISCLOSURE

The present disclosure relates to the field of electronic devices, and, more particularly, to image sensors and related methods.

BACKGROUND

Typically, electronic devices include one or more camera modules for providing enhanced media functionality. For example, the typical electronic device may utilize the camera modules for photo capturing and video teleconferencing. In the typical electronic device with multiple camera modules, the primary camera module has a high pixel density and an adjustable focus lens system, while the secondary camera module is front-facing and has a lower pixel density. Also, the secondary camera module may have a fixed focus lens system.

For example, U.S. Pat. No. 7,880,132 to Brodie et al, assigned in part to the present application's assignee, discloses a camera module for a mobile device. The camera module comprises a lens, a housing carrying the lens, and a lens cap over the lens and housing. The camera module includes a barrel mechanism for adjusting the lens. During manufacture of an electronic device including one or more camera modules, there is a desire to manufacture the electronic device as quickly as possible, particularly in mass production runs.

The typical camera module is manufactured in a multi-step process. The first steps include semiconductor processing to provide the image sensor integrated circuit (IC). The next steps include some form of testing for the image sensor IC and packaging. The image sensor IC may be assembled into the camera module, along with a lens and movable barrel if needed. This assembly of the camera module may be performed manually or via machine. For example, in electronic devices that use surface mounted components, a pick-and-place (PNP) machine may assemble the components onto a printed circuit board (PCB). A drawback to such singular packaging is that it may be relatively inefficient and also may require that each device be tested individually, adding to the manufacturing time.

Referring to FIG. 1, an approach to an image sensing device 20 is shown. The image sensing device 20 includes a flexible connector design that is desirable for mobile applications. The image sensing device 20 illustratively includes an interconnect layer 21, an image sensor IC 22 on the interconnect layer, an adhesive layer 29 between the image sensor IC and the interconnect layer, and a plurality of bond wires 23a-23b coupling the image sensor IC to the interconnect layer. Also, the image sensing device 20 illustratively includes a lens module 27 over the interconnect layer 21, and an adhesive layer 72 coupling the lens module and the interconnect layer 21 together. The image sensing device 20 illustratively includes an adhesive layer 25 on the lens module 27, and an infrared (IR) filter 26 on the adhesive layer. The image sensing device 20 illustratively includes a flexible interconnect layer 30 comprising a connector 31 carried thereby.

SUMMARY

An image sensing device may include an interconnect layer, an image sensor IC coupled to the interconnect layer and having an image sensing surface, and an IR filter aligned with the image sensing surface opposite the interconnect layer. The image sensing device may include a flexible interconnect layer aligned with the interconnect layer and comprising a flexible substrate extending laterally outwardly from the interconnect layer, and a plurality of electrically conductive traces on the flexible substrate. The image sensing device may further include a plurality of solder bodies coupling the interconnect layer and the flexible interconnect layer and also defining a gap between the interconnect layer and the flexible interconnect layer.

More specifically, the flexible interconnect layer may comprise a connector carried by the flexible substrate and coupled to the plurality of electrically conductive traces. The image sensing device may further include a lens assembly aligned with the IR filter. The image sensing device may further comprise an adhesive layer between the interconnect layer and the lens assembly. Also, the image sensor IC may comprise a semiconductor substrate, and a plurality of electrically conductive bond pads adjacent the image sensing surface.

In some embodiments, the image sensing device may further comprise an electronic component carried by the flexible interconnect layer. In other embodiments, the image sensing device may further comprise an electronic component carried internally by the interconnect layer.

Additionally, the interconnect layer may comprise a plurality of electrically conductive traces therein, and a plurality of electrically conductive contacts coupled respectively to the plurality of electrically conductive traces. The image sensing device may also include a plurality of bond wires coupled between the plurality of electrically conductive contacts of the interconnect layer and the image sensor IC.

Another aspect is directed to a method of making an image sensing device. The method may include positioning an image sensor IC coupled to an interconnect layer, the image sensor IC having an image sensing surface opposite the interconnect layer. The method may also include positioning an IR filter aligned with the image sensing surface, and positioning a flexible interconnect layer aligned with the interconnect layer. The flexible interconnect layer may include a flexible substrate extending laterally outwardly from the interconnect layer, and a plurality of electrically conductive traces on the flexible substrate. The method may include forming a plurality of solder bodies coupling the interconnect layer and the flexible interconnect layer and also defining a gap between the interconnect layer and the flexible interconnect layer.

BRIEF DESCRIPTION OF THE DRAWINGS

FIGS. 3-5 are cross-section views of steps in making the image sensing device of FIG. 2.

DETAILED DESCRIPTION OF THE EMBODIMENTS

Figure 1:
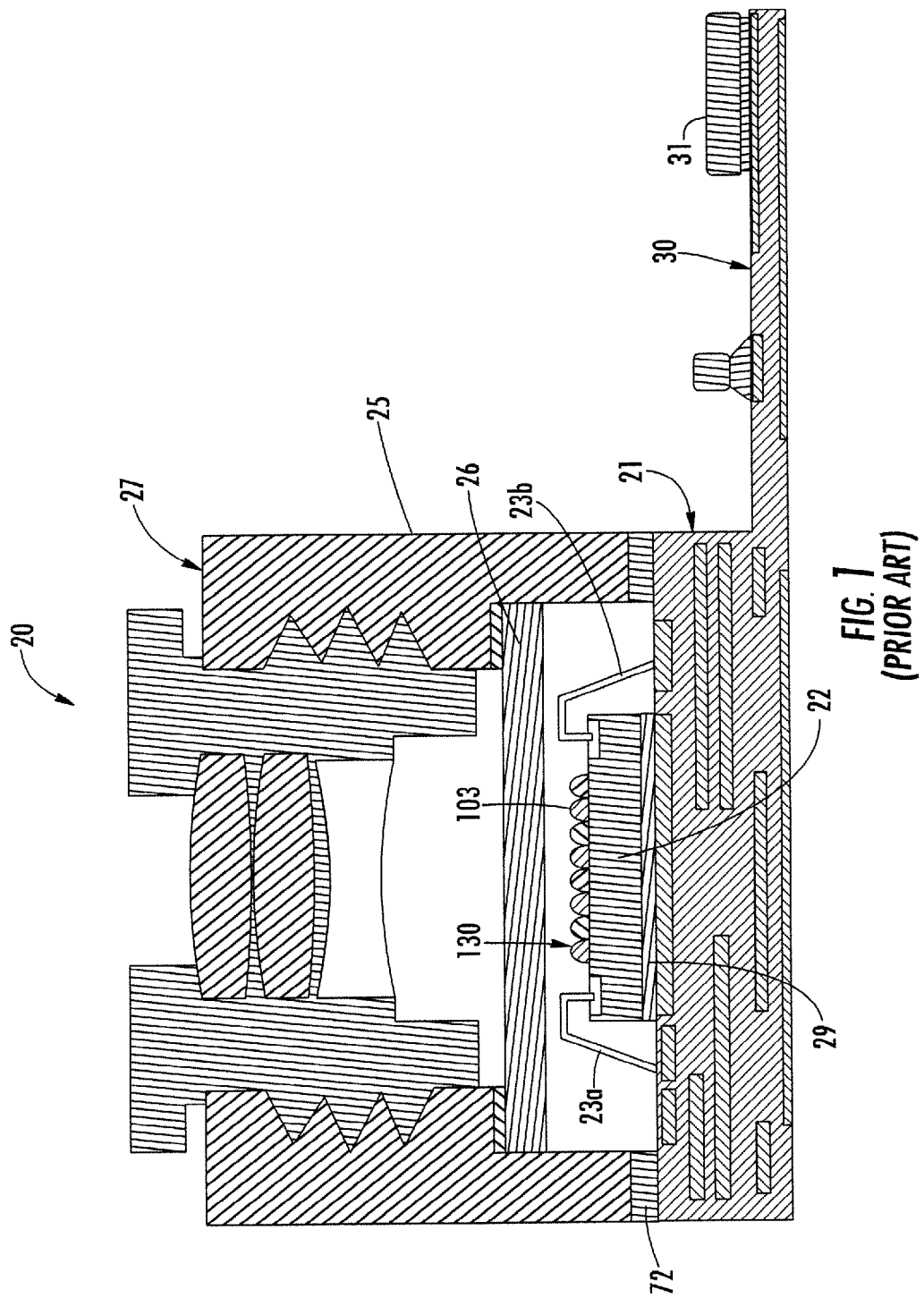
FIG. 1 is a cross-section view of an image sensing device, according to the prior art.

In the approach of FIG. 1, the flexible interconnect layer 30 and the interconnect layer 21 are manufactured in a single process and purchased from a single vendor as a flexible connector component. Notwithstanding the desirability of the flexible connector component feature, the prior art component is costly, which drives up end user prices for the final product (e.g. cellular phones, tablet computing devices). Moreover, the attachment process of the flexible connector component may require expensive machinery and need a mechanically strong module design to maintain module performance and prevent drift.

The present disclosure will now be described more fully hereinafter with reference to the accompanying drawings, in which embodiments of the disclosure are shown. These embodiments may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and prime notation is used to indicate similar elements in alternative embodiments.

Figure 2:
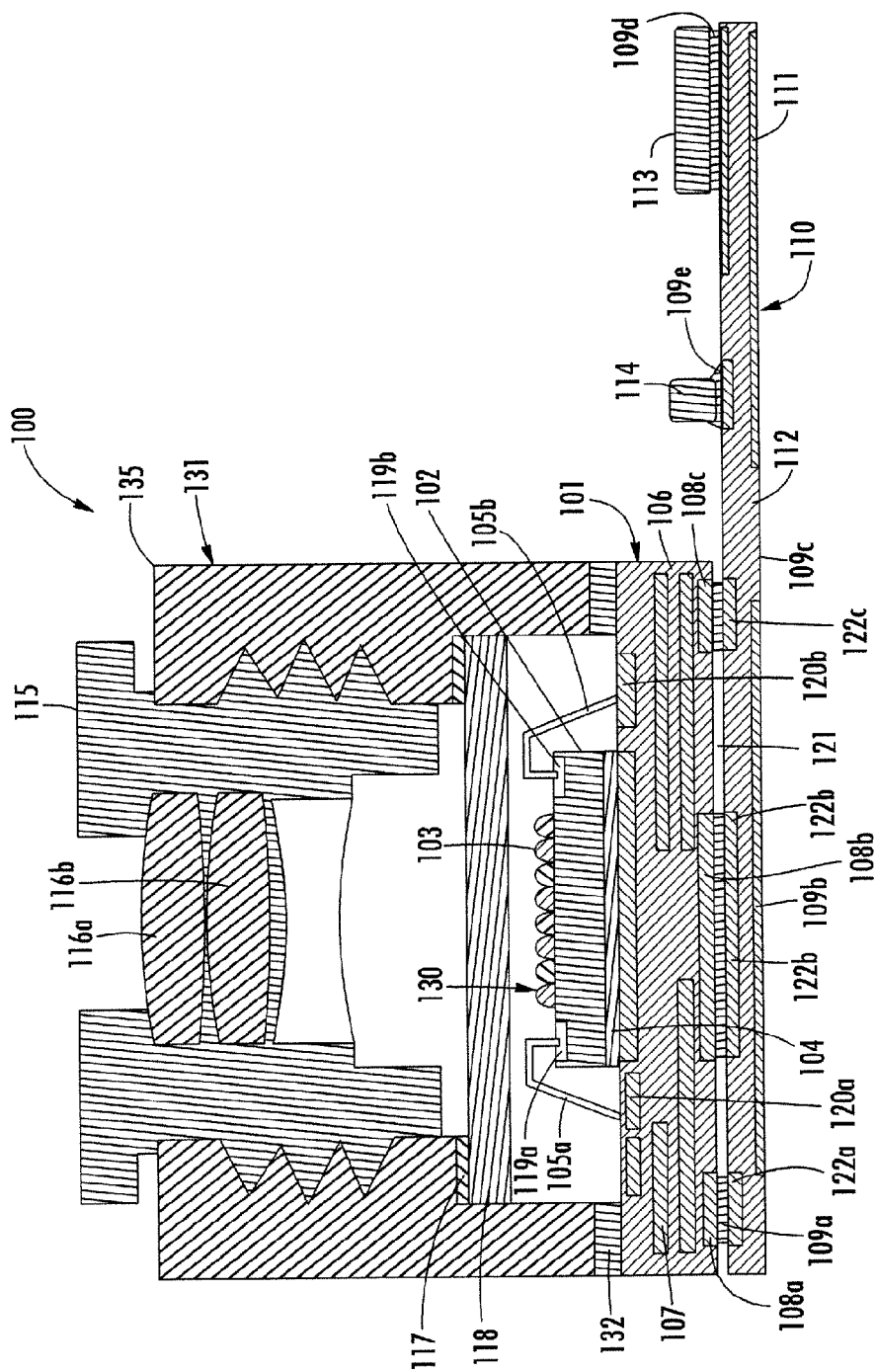
FIG. 2 is a cross-section view of an image sensing device, according to the present disclosure.

Referring initially to FIG. 2, an image sensing device 100 according to the present disclosure is now described. The image sensing device 100 illustratively includes an interconnect layer 101, an image sensor IC 130 coupled to the interconnect layer and having an image sensing surface 103, an adhesive layer 104 between the image sensor IC and the interconnect layer, and an IR filter 118 adjacent and aligned with the image sensing surface opposite the interconnect layer. Also, the image sensor IC 130 illustratively includes a semiconductor substrate 102, and a plurality of electrically conductive bond pads 119a-119b adjacent the image sensing surface.

The interconnect layer 101 illustratively includes a substrate 106, a plurality of electrically conductive traces 107 carried by the substrate, and first and second pluralities of electrically conductive contacts 120a-120b, 108a-108c carried by the substrate and coupled to the electrically conductive traces. The image sensing device 100 illustratively includes a plurality of bond wires 105a-105b coupled between the plurality of electrically conductive contacts 120a-120b of the interconnect layer and the image sensor IC 130.

The image sensing device 100 illustratively includes a flexible interconnect layer 110 aligned with the interconnect layer 101 opposite the image sensing surface 103. The flexible interconnect layer 110 illustratively includes a flexible substrate 112 extending laterally outwardly from the interconnect layer 101, a plurality of electrically conductive traces 111 on the flexible substrate, and a plurality of electrically conductive contacts 122a-122c on the flexible substrate and coupled to the electrically conductive traces. The flexible interconnect layer 110 illustratively includes a connector 113 carried by the flexible substrate 112 and coupled to the plurality of electrically conductive traces 111.

The image sensing device 100 illustratively includes a plurality of solder bodies 109a-109c coupling the interconnect layer 101 and the flexible interconnect layer 110 and also defining a gap 121 between the interconnect layer and the flexible interconnect layer. The gap 121 may have a width in the range of 10-30 µm. Helpfully, the gap 121 provides that the flexible interconnect layer 110 may flex and bend over its entire length, even the portion attached to the interconnect layer 101, providing a more reliable electrical connection.

The image sensing device 100 illustratively includes a lens assembly 131 adjacent the interconnect layer 101 and aligned with the IR filter 118. The lens assembly 131 illustratively includes a housing 135, a lens barrel 115 carried by the housing, and a plurality of lenses 116a-116b carried by the lens barrel. The image sensing device 100 illustratively includes an adhesive layer 132 between the interconnect layer 101 and the lens assembly 131. Also, the image sensing device 100 illustratively includes an adhesive layer 117 between the housing 135 and the IR filter 118.

In the illustrated embodiment, the image sensing device 100 further comprises a surface mounted electronic component 114 (e.g. a capacitor, a resistor, a processor) carried by the flexible interconnect layer 110 and coupled to the electrically conductive traces 111, and a solder body 109e coupling the electronic component and the flexible interconnect layer. The image sensing device 100 further comprises a solder body 109d between the connector 113 and the flexible interconnect layer 110. In some embodiments, the solder bodies 109a-109e may alternatively comprise solder paste, conductive adhesive material, or conductive adhesive film.

As will be appreciated, any of the above noted electrically conductive components may comprise at least one of copper, aluminum, gold, tin, and silver. This list is merely exemplary and many other electrically conductive materials can be used. Moreover, the substrates 106, 112 may comprise a dielectric material.

Advantageously, the image sensing device 100 is manufactured with less cost. This is in contrast to the prefabricated flexible connector component of the prior art (FIG. 1). The associated method detailed herein for making the image sensing device 100 uses easy surface mounting techniques, which are standard, low cost, and robust, rather than the complex machine driven approach of the prior art.

Another aspect is directed to a method of making an image sensing device 100. The method may include positioning an image sensor IC 130 coupled to an interconnect layer 101 and having an image sensing surface 103, and positioning an IR filter 118 adjacent and aligned with the image sensing surface opposite the interconnect layer. The method may include positioning a flexible interconnect layer 110 aligned with the interconnect layer 101 opposite the image sensing surface 103. The flexible interconnect layer 110 includes a flexible substrate 112 extending laterally outwardly from the interconnect layer, and a plurality of electrically conductive traces 111 on the flexible substrate. The method may include forming a plurality of solder bodies 109a-109c coupling the interconnect layer 101 and the flexible interconnect layer 110 and also defining a gap 121 between the flexible interconnect layer and the interconnect layer.

Referring now additionally to FIGS. 3-5, an exemplary embodiment of a method for making the image sensing device 100 is now described. In FIG. 3, the flexible substrate 112 is prepared, and in FIG. 4, the plurality of solder bodies 109a-109e is formed on flexible substrate 112. For example, the plurality of solder bodies 109a-109e may be formed using reflow soldering process. In FIG. 5, the interconnect layer 101, the electrical component 114, and the connector 113 are mounted on the flexible substrate 112. Subsequently, the image sensor IC 130, and the lens assembly 131 are mounted onto the interconnect layer 101.

Figure 6:
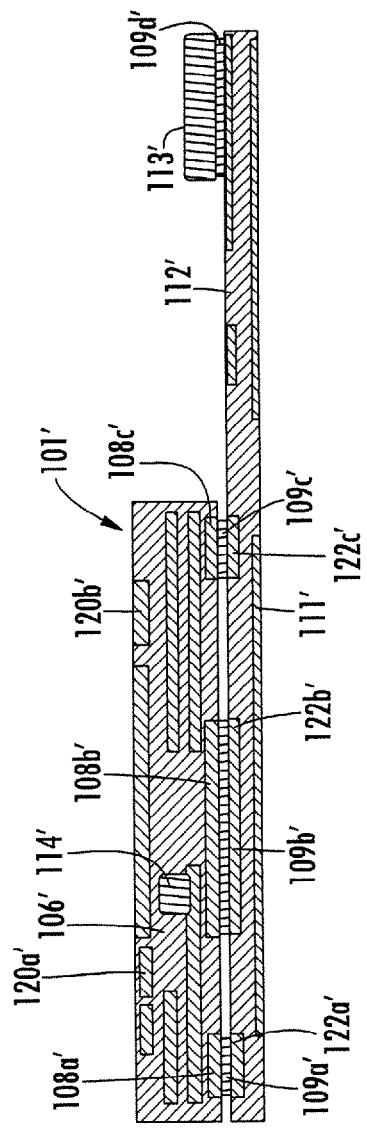
FIG. 6 is a cross-section view of another embodiment of the flexible connector component, according to the present disclosure.

Referring now additionally to FIG. 6, another embodiment of the image sensing device 100' is now described. In this embodiment of the image sensing device 100', those elements already discussed above with respect to FIGS. 2-5 are given prime notation and most require no further discussion herein. This embodiment differs from the previous embodiment in that this image sensing device 100' further comprises an electronic component 114' carried internally (i.e. embedded within) by the interconnect layer 101'.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. An image sensing device comprising:
   an interconnect layer;
   an image sensor integrated circuit (IC) coupled to said interconnect layer and having an image sensing surface opposite said interconnect layer;
   an infrared (IR) filter aligned with the image sensing surface;
   a lens assembly aligned with said IR filter;
   a flexible interconnect layer aligned with said interconnect layer and comprising
      a flexible substrate extending laterally outwardly from said interconnect layer and configured to bend freely in a direction transverse to said interconnect layer,
      a plurality of electrically conductive traces on said flexible substrate, and
      a connector carried by said flexible substrate, spaced apart from said interconnect layer, and coupled to said plurality of electrically conductive traces; and
   a plurality of solder bodies coupling said interconnect layer and said flexible interconnect layer and also defining a gap between said interconnect layer and said flexible interconnect layer.

2. The image sensing device of claim 1 further comprising an adhesive layer between said interconnect layer and said lens assembly.

3. The image sensing device of claim 1 wherein said image sensor IC comprises a semiconductor substrate, and a plurality of electrically conductive bond pads adjacent the image sensing surface.

4. The image sensing device of claim 1 further comprising an electronic component carried by said flexible interconnect layer.

5. The image sensing device of claim 1 further comprising an electronic component carried internally by said interconnect layer.

6. The image sensing device of claim 1 wherein said interconnect layer comprises a plurality of electrically conductive traces therein, and a plurality of electrically conductive contacts coupled respectively to said plurality of electrically conductive traces of said interconnect layer.

7. The image sensing device of claim 1 wherein the gap has a width in a range of 10-30 μm.

8. The image sensing device of claim 1 wherein said flexible substrate bends along an entire length thereof.

9. An image sensing device comprising:
   an interconnect layer;
   an image sensor integrated circuit (IC) coupled to said interconnect layer and having an image sensing surface opposite said interconnect layer;
   an infrared (IR) filter aligned with the image sensing surface;
   a flexible interconnect layer aligned with said interconnect layer and comprising
      a flexible substrate extending laterally outwardly from said interconnect layer and configured to bend freely in a direction transverse to said interconnect layer, and
      a plurality of electrically conductive traces on said flexible substrate; and
   a plurality of solder bodies coupling said interconnect layer and said flexible interconnect layer and also defining a gap between said interconnect layer and said flexible interconnect layer;
   said flexible interconnect layer configured to bend within the gap.

10. The image sensing device of claim 9 wherein said flexible interconnect layer comprises a connector carried by said flexible substrate and coupled to said plurality of electrically conductive traces.

11. The image sensing device of claim 9 further comprising a lens assembly aligned with said IR filter.

12. The image sensing device of claim 11 further comprising an adhesive layer between said interconnect layer and said lens assembly.

13. The image sensing device of claim 9 wherein said image sensor IC comprises a semiconductor substrate, and a plurality of electrically conductive bond pads adjacent the image sensing surface.

14. The image sensing device of claim 9 further comprising an electronic component carried by said flexible interconnect layer.

15. The image sensing device of claim 9 further comprising an electronic component carried internally by said interconnect layer.

16. The image sensing device of claim 9 wherein the gap has a width in a range of 10-30 μm.

17. The image sensing device of claim 9 wherein said flexible substrate bends along an entire length thereof.

18. An image sensing device comprising:
   an interconnect layer comprising a plurality of electrically conductive traces therein, and a plurality of electrically conductive contacts coupled respectively to said plurality of electrically conductive traces of said interconnect layer;
   an image sensor integrated circuit (IC) coupled to said interconnect layer and having an image sensing surface opposite said interconnect layer;
   an infrared (IR) filter aligned with the image sensing surface;
   a flexible interconnect layer aligned with said interconnect layer and comprising
      a flexible substrate extending laterally outwardly from said interconnect layer and configured to bend freely in a direction transverse to said interconnect layer, and
      a plurality of electrically conductive traces on said flexible substrate; and
   a plurality of solder bodies coupling said interconnect layer and said flexible interconnect layer and also defining a gap between said interconnect layer and said flexible interconnect layer;
   said flexible interconnect layer configured to bend within the gap.

19. The image sensing device of claim 18 further comprising a plurality of bond wires coupled between said plurality of electrically conductive contacts of said interconnect layer and said image sensor IC.

20. The image sensing device of claim 18 wherein the gap has a width in a range of 10-30 μm.

21. The image sensing device of claim 18 wherein said flexible substrate bends along an entire length thereof.

22. The image sensing device of claim 18 wherein said flexible interconnect layer comprises a connector carried by said flexible substrate and coupled to said plurality of electrically conductive traces of said flexible interconnect layer.

23. The image sensing device of claim 18 further comprising a lens assembly aligned with said IR filter.

24. The image sensing device of claim 23 further comprising an adhesive layer between said interconnect layer and said lens assembly.

* * * * *